(12) United States Patent
Reznicek et al.

(10) Patent No.: US 11,189,661 B2
(45) Date of Patent: Nov. 30, 2021

(54) FINFET 2T2R RRAM

(71) Applicant: International Business Machines Corporation, Armonk, NY (US)

(72) Inventors: Alexander Reznicek, Troy, NY (US); Takashi Ando, Eastchester, NY (US); Pouya Hashemi, Purchase, NY (US); Choonghyun Lee, Rensselaer, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 16/562,388

(22) Filed: Sep. 5, 2019

(65) Prior Publication Data
US 2021/0074765 A1    Mar. 11, 2021

(51) Int. Cl.
*H01L 45/00* (2006.01)
*H01L 27/24* (2006.01)
*H01L 29/78* (2006.01)
*H01L 29/04* (2006.01)
*H01L 29/10* (2006.01)
(Continued)

(52) U.S. Cl.
CPC ...... *H01L 27/2436* (2013.01); *H01L 27/2463* (2013.01); *H01L 29/045* (2013.01); *H01L 29/0847* (2013.01); *H01L 29/1037* (2013.01); *H01L 29/66545* (2013.01); *H01L 29/66795* (2013.01); *H01L 29/785* (2013.01); *H01L 45/1233* (2013.01); *H01L 45/1253* (2013.01); *H01L 45/146* (2013.01); *H01L 45/1616* (2013.01); *H01L 29/6656* (2013.01)

(58) Field of Classification Search
CPC .................................................. H01L 45/1273
See application file for complete search history.

(56) References Cited

U.S. PATENT DOCUMENTS 8,045,361 B2    10/2011    Lee et al.
8,064,248 B2    11/2011    Lung
(Continued)

OTHER PUBLICATIONS

Tayfun Gokmen and Yurii Vlasov, "Acceleration of Deep Neural Network Training with Resistive Cross-Point Devices: Design Considerations", Front. Neurosci., Jul. 21, 2016 | https://doi.org/10. 3389/fnins.2016.00333; IBM T. J. Watson Research Center, Yorktown Heights, NY, USA.

(Continued)

*Primary Examiner* — Christopher A Johnson
(74) *Attorney, Agent, or Firm* — L. Jeffrey Kelly; Lou Percello, Attorney, PLLC

(57) ABSTRACT

A first fin field effect transistor (FinFET) has an internal source/drain (S/D) with a facetted face that is connected to a dielectric side of a first RRAM. A second FinFET and RRAM structure are also disclosed. In some embodiments, an electrode contact side of each RRAM is connected in common to form a 2T2R device. The locations of one or more electrode points on the diamond-shaped, facetted surface of the bottom electrode accurately position electric fields through the dielectric to accurately and repeatably locate where the filaments/current paths are formed (or reset) through the RRAM dielectric. Material selection and accurate thickness of the RRAM dielectric determine the voltage at which the filaments/current paths are formed (or reset).

19 Claims, 15 Drawing Sheets

(51) Int. Cl.
   *H01L 29/66* (2006.01)
   *H01L 29/08* (2006.01)

(56) References Cited

U.S. PATENT DOCUMENTS

| | | |
|---|---|---|
| 8,113,437 B2 | 2/2012 | Kang |
| 9,076,523 B2 | 7/2015 | Lee et al. |
| 9,178,000 B1 | 11/2015 | Nardi et al. |
| 9,831,288 B2 | 11/2017 | Grenouillet et al. |
| 2015/0262663 A1 | 9/2015 | Lee et al. |
| 2019/0080754 A1* | 3/2019 | Tran ................... G11C 13/004 |
| 2019/0123104 A1* | 4/2019 | Yang ................... H01L 45/146 |
| 2020/0372955 A1* | 11/2020 | Chen ................. G11C 13/0069 |

OTHER PUBLICATIONS

Geoffrey W. Burr, Robert M. Shelby, Severin Sidler, Carmelo di Nolfo, Junwoo Jang, Irem Boybat, Rohit S. Shenoy, Pritish Narayanan, Kumar Virwani, Emanuele U. Giacometti, Bülent N. Kurdi, and Hyunsang Hwang; "Experimental Demonstration and Tolerancing of a Large-Scale Neural Network (165 000 Synapses) Using Phase-Change Memory as the Synaptic Weight Element", IEEE Transactions on Electron Devices, vol. 62, No. 11, Nov. 2015.

Hsin Wei Pan, Kai Ping Huang, Shih Yu Chen, Ping Chun Peng, Zhi Sung Yang, Cheng-Hsiung Kuo, Yue-Der Chih, Ya-Chin King, Chrong Jung Lin; "1Kbit FINFET Dielectric (FIND) RRAM in Pure 16nm FinFET CMOS Logic Process", Microelectronics Laboratory, Institute of Electronics Engineering, National Tsing Hua University, Hsinchu, Taiwan; Design Technology Division, Taiwan Semiconductor Manufacturing Company, Hsinchu 300, Taiwan.

\* cited by examiner

FINFET 2T2R RRAM

BACKGROUND

The present invention relates to Random-Access Memory (RAM), and more specifically, to Resistive RAM (RRAM).

A dielectric, which is normally insulating, can be made to conduct (low resistance state (LRS)) through one or more filaments or conduction paths formed by application of a sufficiently high voltage. Once the filament/path is formed, it may be "reset" (broken, resulting in high resistance state (HRS)) or "set" (re-formed, resulting in lower resistance) by a voltage change. Some RRAMs are made on complementary metal oxide semiconductor (CMOS) fin structures. It is also possible to store intermediate states between LRS and HRS by changing the configuration of filaments via electrical bias.

However, many current RRAM designs do not control the position or formation of the filament/conducting paths) accurately. This results in variable, non-repeatable performance.

In addition, many of the current designs require to form filaments in larger devices, i.e., device designs do not scale easily.

RRAM can have a polarity that is either unipolar or bipolar. Unipolar devices switch depending on a magnitude of voltage applied. On the other hand, bipolar devices require the applied voltage to reverse polarity to switch. For example, bipolar devices reverse polarity when switching from set to reset while unipolar devices do not change polarity when switching.

RRAM is used in high-density, high-speed non-volatile memory applications and is a promising technology for electronic synapse devices or memristors in neuromorphic computing. These applications require devices with predictable and repeatable switching performance.

There is a need for RRAM with consistent performance (accurate and predictable filament formation and resetting) that are easily scaled with standard manufacturing processes.

SUMMARY

Embodiments of structures of, methods of making, and methods of using a resistive random-access memory (RRAM) device are disclosed. In one embodiment, a fin field effect transistor (FinFET) comprises a channel, an external source/drain (S/D), an internal S/D, and a gate stack encompassing the channel. The internal S/D is epitaxially grown to form a diamond shaped, facetted bottom electrode. A RRAM has a dielectric as a S/D side and an electrode as a contact side. The RRAM is dielectric disposed on the diamond-shaped, facetted bottom electrode with the RRAM dielectric physically and electrically connected to the bottom electrode. The locations of one or more electrode points on the diamond-shaped, facetted surface of the bottom electrode accurately position electric fields through the dielectric to accurately and repeatably locate where the filaments/ current paths are formed (or reset) through the RRAM dielectric. Material selection and accurate thickness of the RRAM dielectric determine the voltage at which the filaments/current paths are formed (or reset). A 2T2R (two transistors, two resistors) structure is described. In some embodiments of the 2T2R, the contact sides of the two RRAMs are connected in common.

DETAILED DESCRIPTION

Figure 1:
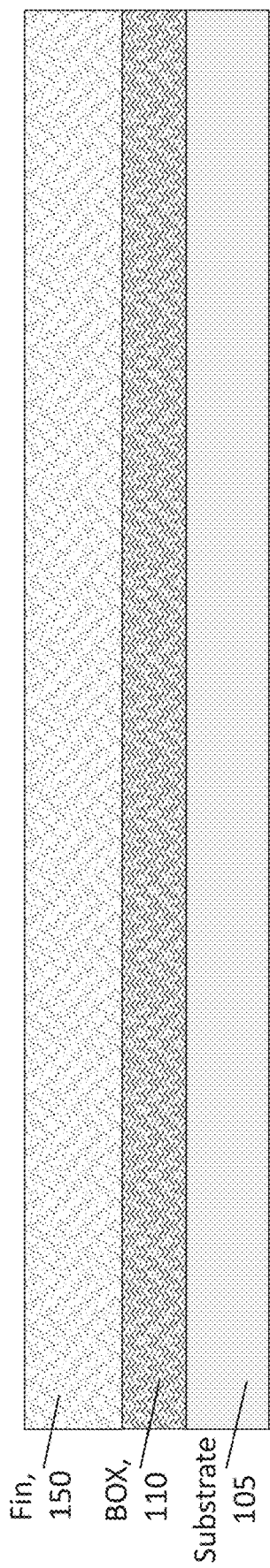
FIG. 1 is a cross section view of an initial structure used to begin making a RRAM.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, unless otherwise defined, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Unless otherwise specifically noted, the same reference numbers in different figures have the same description and refer to the same elements.

The figures are not drawn to scale. For example, in FIG. 2, the height of the dummy gate 225 can be 3 or more times the width of the dummy gate 225. See description below.

FIG. 1 is a cross section view of an initial structure 100 used to begin making the RRAM.

In some embodiments, a substrate 105 is made of one or more bulk semiconductor materials. Non-limiting examples include: Si (silicon), strained Si, SiC (silicon carbide), Ge (germanium), SiGe (silicon germanium), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. In addition, multiple layers of the semiconductor materials can be used as the semiconductor material of the substrate 105. In some embodiments, the substrate 105 includes both semiconductor materials and dielectric materials.

In some silicon-on-insulator (SOI) implementations, a BOX layer 110 is a buried oxide layer (e.g., SiO2) buried in the substrate (wafer) 105 typically at the depth ranging from less than 100 nanometers (nm) to several micrometers from the wafer surface, depending on application. The thickness of BOX layer 110 is typically in the range from about 20 nm to about 150 nm.

One or more fins 150 are formed either on the surface of the substrate 105 or over the BOX layer 110, using known methods.

The fins 150 are made of either Silicon (Si) or Silicon Germanium (SiGe).

Figure 2:
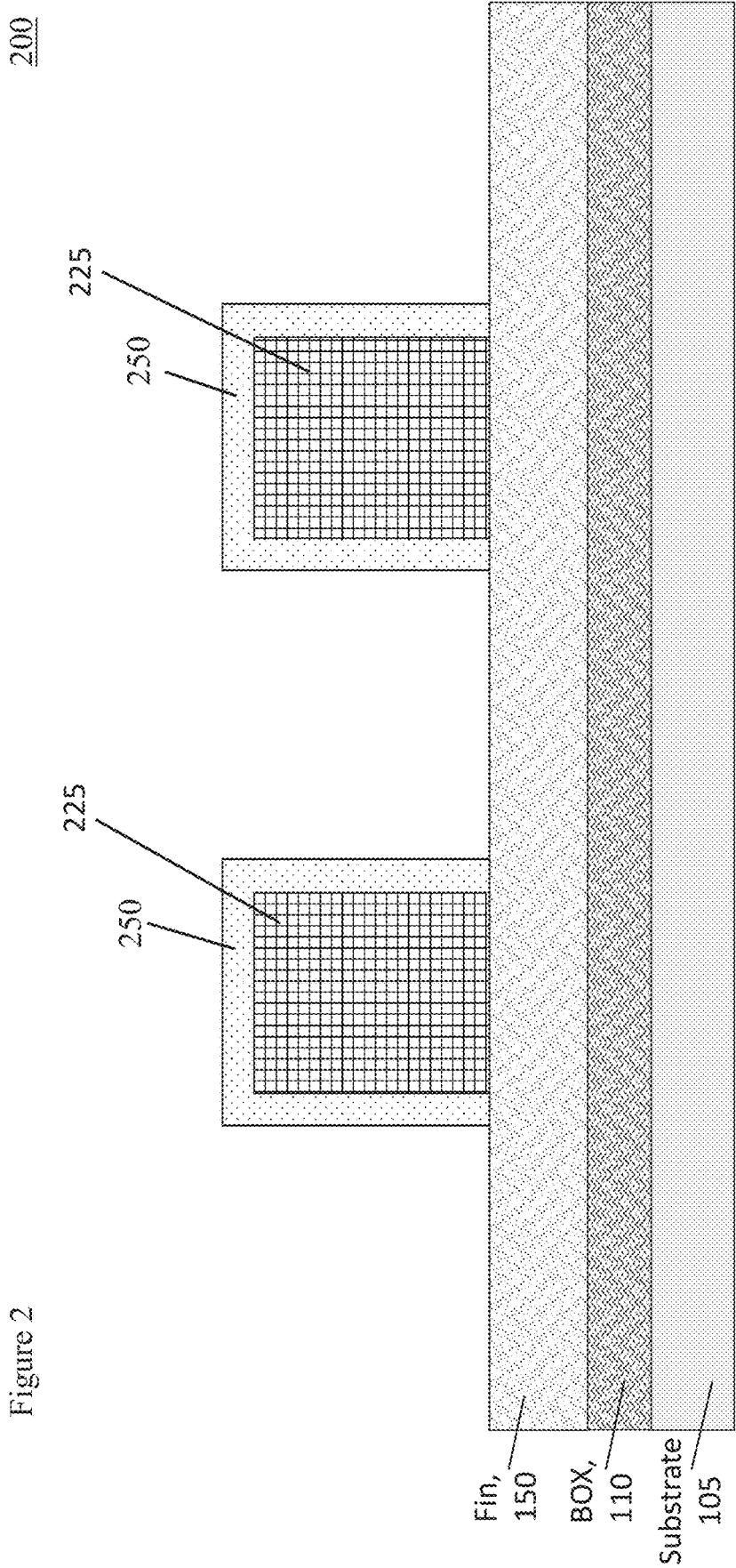
FIG. 2 is a cross section view of an interim structure showing two dummy gates encompassed by a spacer.

FIG. 2 is a cross section view of an interim structure 200 showing two dummy gates 225 composed on a fin 150 each dummy gate 225 encompassed by a spacer 250.

Known techniques are used to form a first and second dummy gate 225 on and encompassing each of one or more of the tins 150. (Masking steps are not shown for clarity.)

The dummy gates 225 are made of a sacrificial gate material including, for example, amorphous silicon (α-Si) or polycrystalline silicon (polysilicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

In some embodiments, the sacrificial material forming the dummy gate 225 has a height between 30 nm to 150 nm, or alternatively between 30 nm to 100 nm. In some embodiments, the dummy gate 225 has a width of between 10 nm and 50 nm or alternatively about 10 nm. Other heights and widths are possible.

Next a spacer 250 material is disposed on and around each of the dummy gates 225. The spacer 250 encompasses a region of the fin 150 as well. In some embodiments the width/thickness of the spacers 250 is between 3 nm and 10 nm. In alternative embodiments, the spacer 250 thickness is about 5 nm to 7 nm.

In some embodiments, the spacers 250 are made of materials including: dielectric oxides (e.g., silicon oxide), dielectric nitrides (e.g., silicon nitride (SiN), SiBCN, SiCN, and SiBN), dielectric oxynitrides, (e.g. SiOCN), SiCO, and SiC, or any combination thereof.

Figure 3:
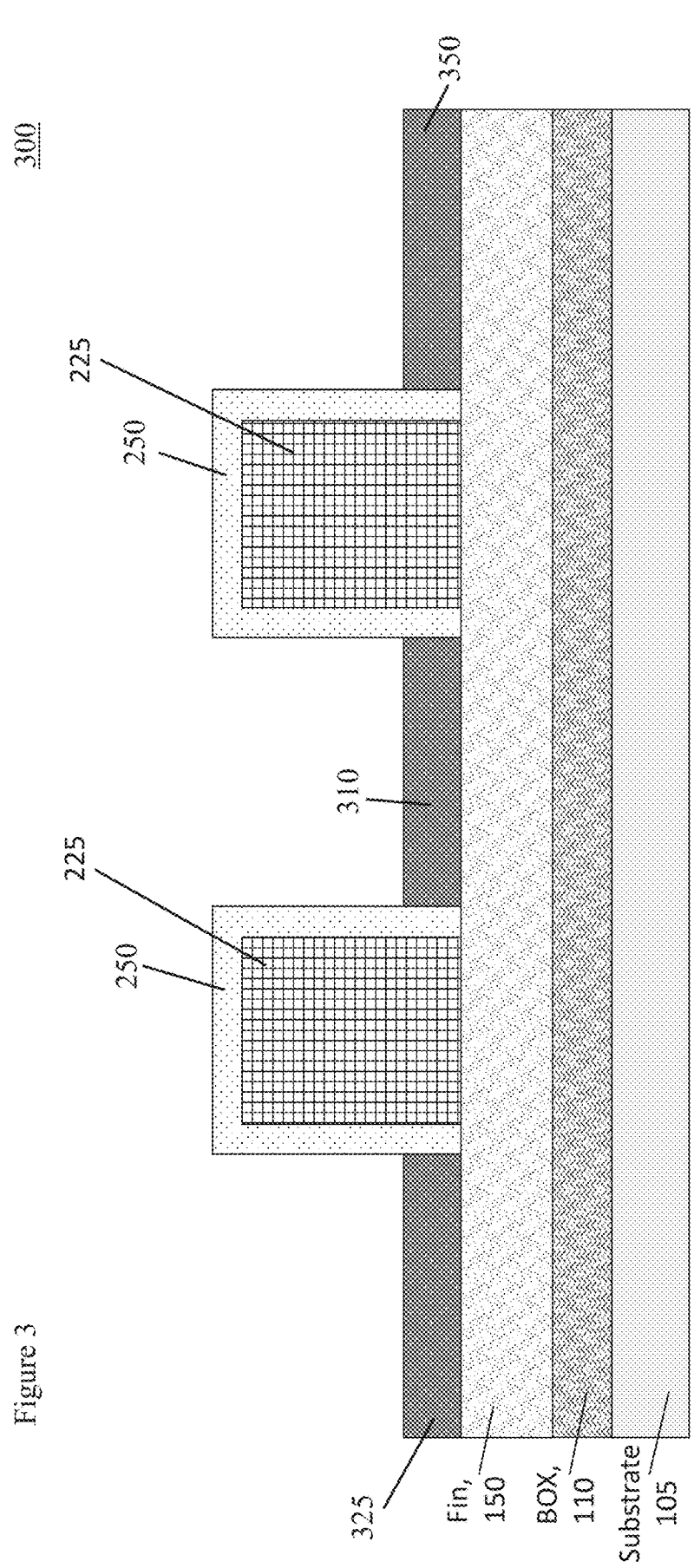
FIG. 3 is a cross section view of an interim structure with formed source/drain (S/D) regions.

FIG. 3 is a cross section view of an interim structure 300 with formed source/drain (S/D) regions (310, 325, and 350). The S/D regions are epitaxially grown on top and encompassing the exposed sidewalls of the semiconductor fins 150. The S/D regions are either n-type or p-type depending on the doping. S/D region 325 is a first external S/D (in a first transistor to be formed) and S/D region 350 is a second external S/D (in a second transistor to be formed). S/D region 310 will be removed later in the process.

The S/D regions (310, 325, 350) are formed by incorporating dopants during the epitaxial growth. The n-type dopant is selected from a group of phosphorus (P), arsenic (As) and antimony (Sb). The p-type dopant is selected from a group of boron (B), gallium (Ga), indium (In), and thallium (Tl). In some embodiments, the S/D regions (310, 325, 350) are heavily doped with a dopant concentration in a range from $4\times10^{20}$ cm$^{-3}$ to about $2.5\times10^{21}$ cm$^{-3}$. The top thickness of the S/D regions (310, 325, 350) is in a range between 10 nm to 100 nm, or alternatively between 20 nm to 40 nm.

Figure 4:
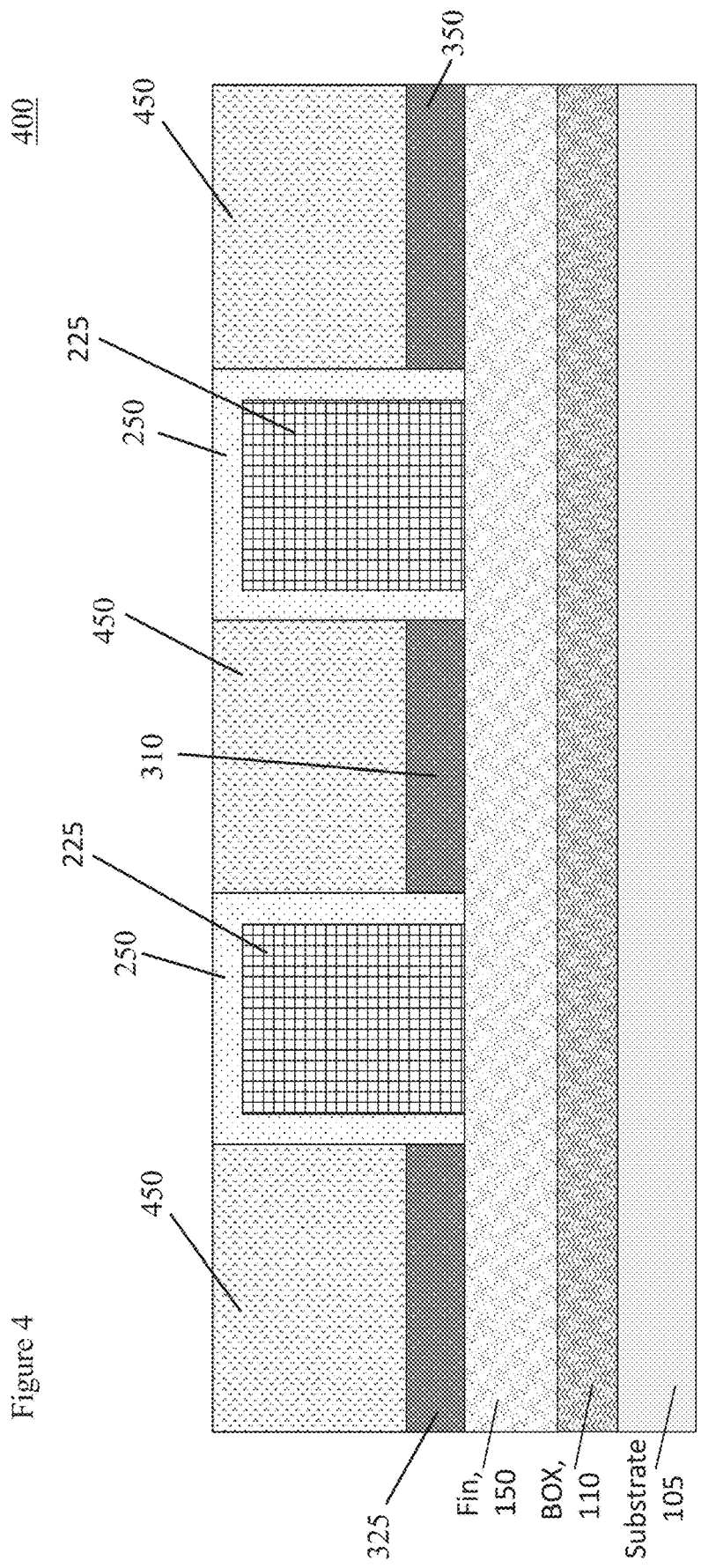
FIG. 4 is a cross section view of an interim structure after deposition of an interlayer dielectric (ILD) and a chemical, mechanical polishing (CMP).

FIG. 4 is a cross section view of an interim structure 400 after deposition of an interlayer dielectric (ILD) 450 and a chemical, mechanical polishing (CMP).

The material in the ILD 450 can be a low-k dielectric material (with k<4.0), including but not limited to: silicon oxide, spin-on-glass, flowable oxide, high-density plasma oxide, or any combination thereof. The ILD 450 is deposited by a deposition process, including, but not limited to: CVD, PVD, PECVD, atomic layer deposition (ALD), evaporation, chemical solution deposition, or like processes.

The CMP levels the top of the structure 400 and stops at the top of the spacers 250 so that the tops of the spacers 250 and ILD 450 are coplanar. The spacers 250 remain encompassing the dummy gate 225 so none of the dummy gate 225 is exposed.

Figure 5:
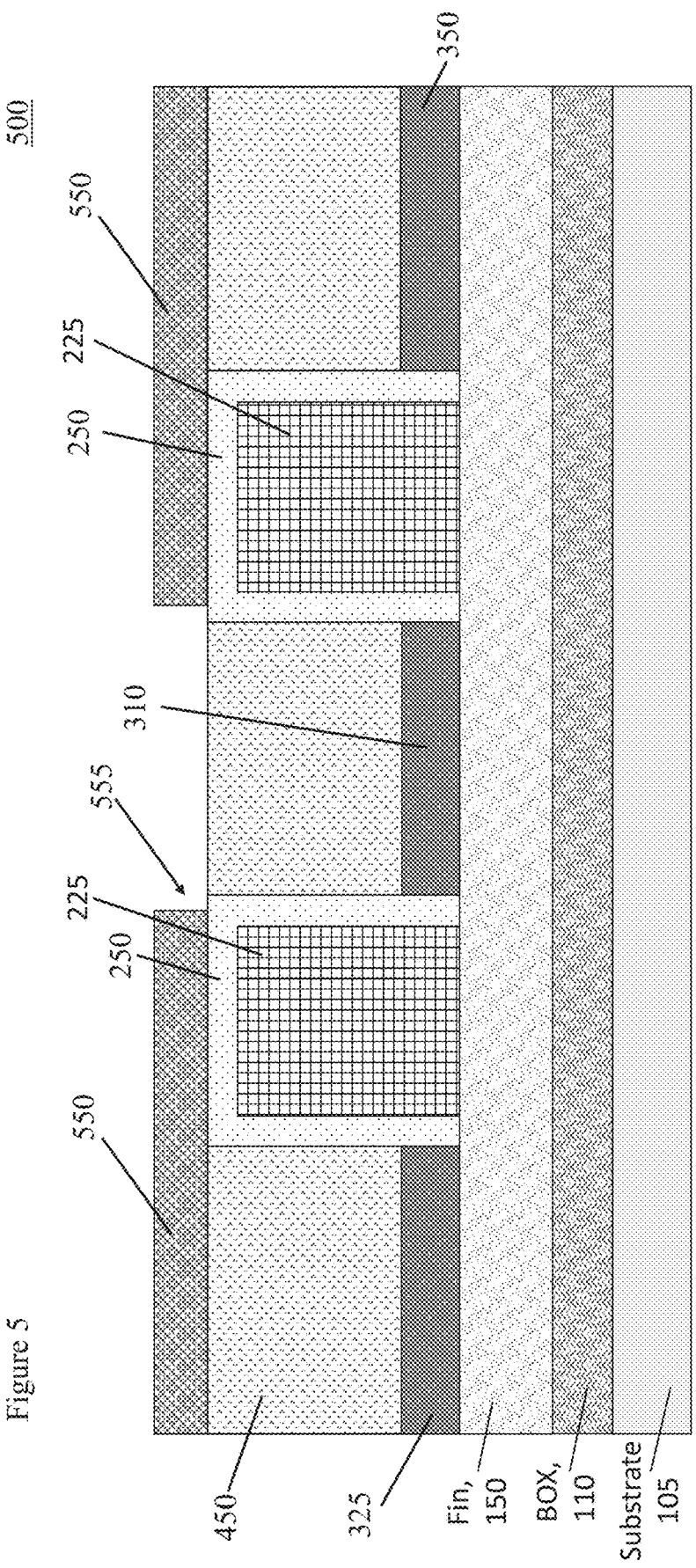
FIG. 5 is a cross section view of an interim structure after formation of a hard mask.

FIG. 5 is a cross section view of an interim structure 500 after formation of a hard mask 550. The hard mask 550 is made of a dielectric material like Silicon Nitride (SiN). The hard mask does not have to be perfectly aligned 555 to protect the region between the dummy gates 225/spacers 250 because the spacers 250 will also protect the dummy gates 225 during the material removal in the next step of the process.

Figure 6:
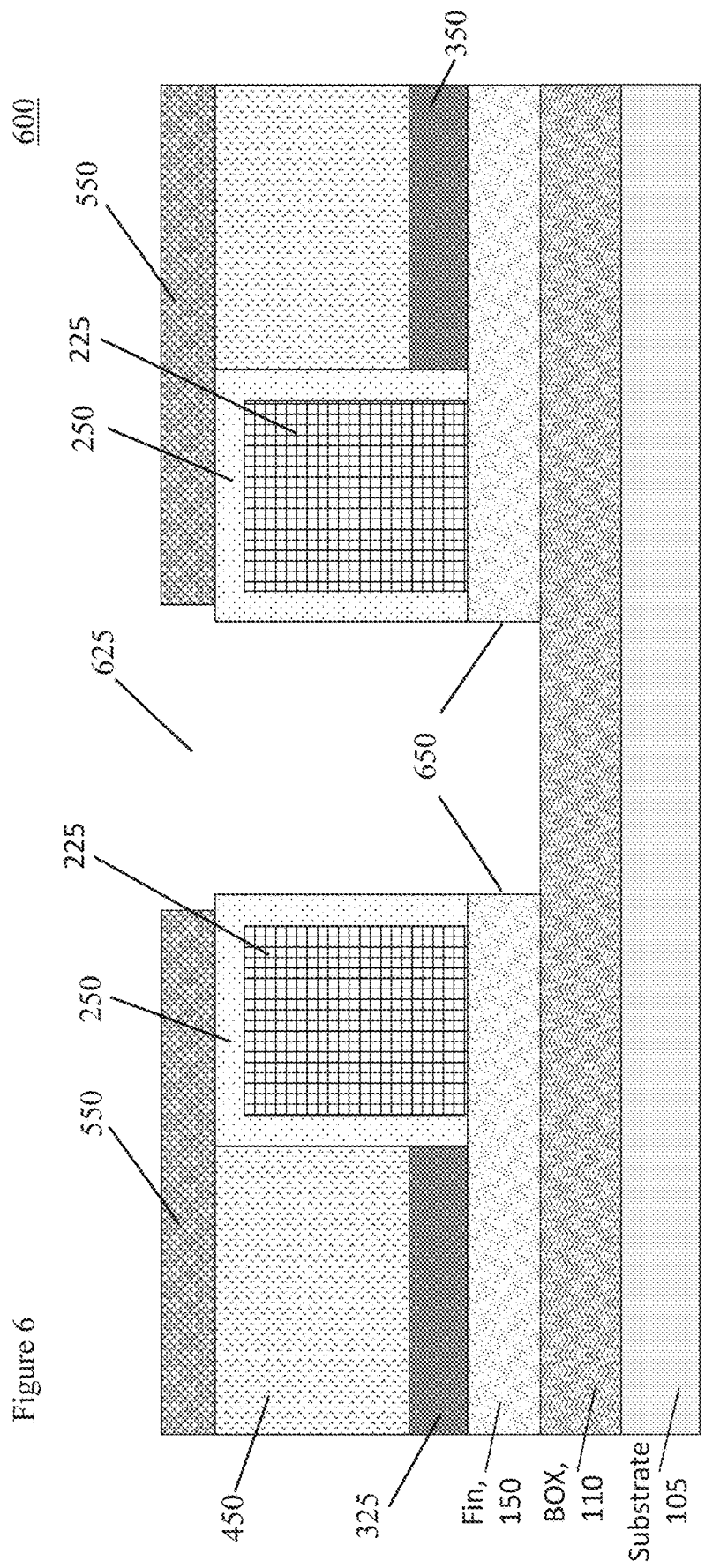
FIG. 6 is a cross section view of an interim structure after removal of epitaxial layer, and fin material between the dummy gates.

FIG. 6 is a cross section view of an interim structure 600 after removal of the ILD 450, the S/D region 310, and the fin 150 material between the spacers 250. In some embodiments, the material is removed by a reactive ion etch (RIE). In alternative embodiments, the ILD 450 can be removed by a wet etch followed by a R1E. This step forms an opening 625 between the spacers 250 and exposes the ends 650 of the fins 150 which face into the opening 625 and oppose one another.

Figure 7:
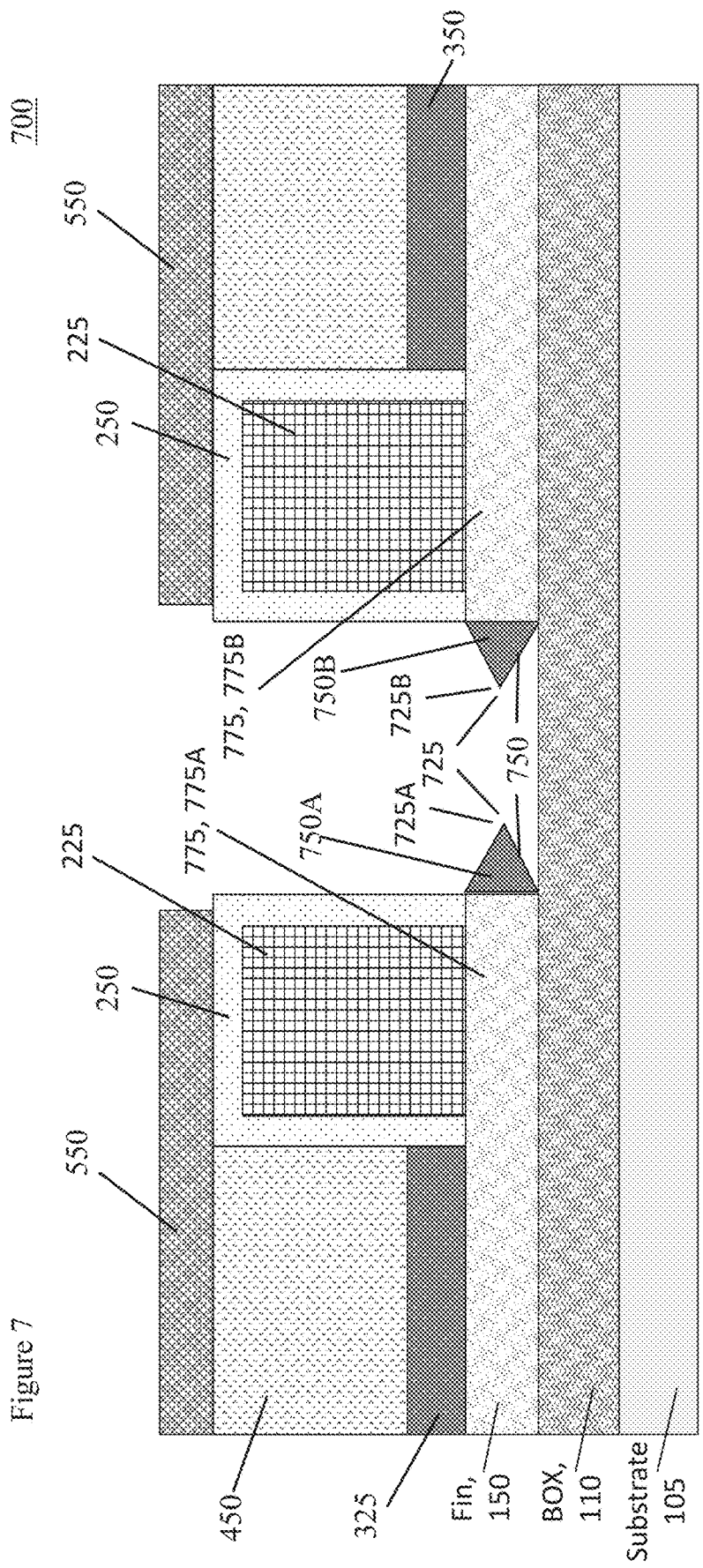
FIG. 7 is a cross section view of an interim structure showing an epitaxial growth of internal, facetted, or diamond-shaped S/D regions.

FIG. 7 is a cross section view of an interim structure 700 showing a selective epitaxial growth of a facetted or diamond-shaped first RRAM bottom electrode 750A and second 750B RRAM bottom electrode (collectively bottom electrodes 750) on the exposed ends 650 of the fins 150. The RRAM bottom electrodes 750 are epitaxially grown as a first internal S/D 750A and a second internal S/D 750B, respectively, and are doped the same as the first 325 and second 350 S/D regions, as described above. (Note that the epitaxial growth is selective, i.e., there is no epitaxial growth on the non-crystalline, dielectric spacers 250 or the BOX 110. In alternative embodiments with no BOX 110, known techniques would be used to deposit protective layers on the horizontal surface of the substrate 105 between the ends 650 to prevent epitaxial growth on the substrate 105 surface between the ends 650.)

In some embodiments, the ends 650 of the fins 150 are perpendicular to the surface of the substrate 105. Therefore, the ends 650 of the fin 150 have a different crystal surface orientation, e.g. a Miller index of (110), than the crystal surface orientation on the horizontal surface of the substrate 105 e.g. with a Miller index of (100). Since the (110) orientation has a higher density of atoms at its surface, the first 750A and second 750B internal S/D layers will epitaxially grow more slowly. When the epitaxial growth is timed correctly a (111) surface bound diamond-shaped, facetted surface of two bottom electrodes 750 with one or more sharp edges and/or points 725 will grow. Epitaxial growth formation of diamond-shaped structures is well known in the FinFET technology.

Since the first 750A and second 750B diamond-shaped, facetted surfaced bottom electrodes 750 grow the same way and at the same rate, the points 725, or electrode points 725, of each of the RRAM bottom electrodes 750 face each other across the opening 625 and are aligned, e.g. are mirror images.

In some embodiments, the epitaxial grown of the RRAM bottom electrodes 750 is time-controlled and/or self-limiting as determined by the fin height and depth (into the plane of the Figure) of the exposed end 650.

In preferred embodiments, the conditions for the epitaxial growth of the RRAM bottom electrodes 750 are at a temperature in the range between 450 and 650 degree Celsius However, the epitaxial growth of the RRAM bottom electrodes 750 depends on many factors including the material, temperature, time, geometries, partial pressure, and doping. Therefore, other temperatures and times of exposure are possible as can be determined by standard practice.

A first 775A and a second 775B channel region (typically 775) are defined between the first exterior S/D regions 325 and the first RRAM bottom electrode 750A and the second exterior S/D regions 350 and the second RRAM bottom electrode 750B, respectively. The gates formed below will surround these channels 775. See description of FIG. 12.

Figure 8:
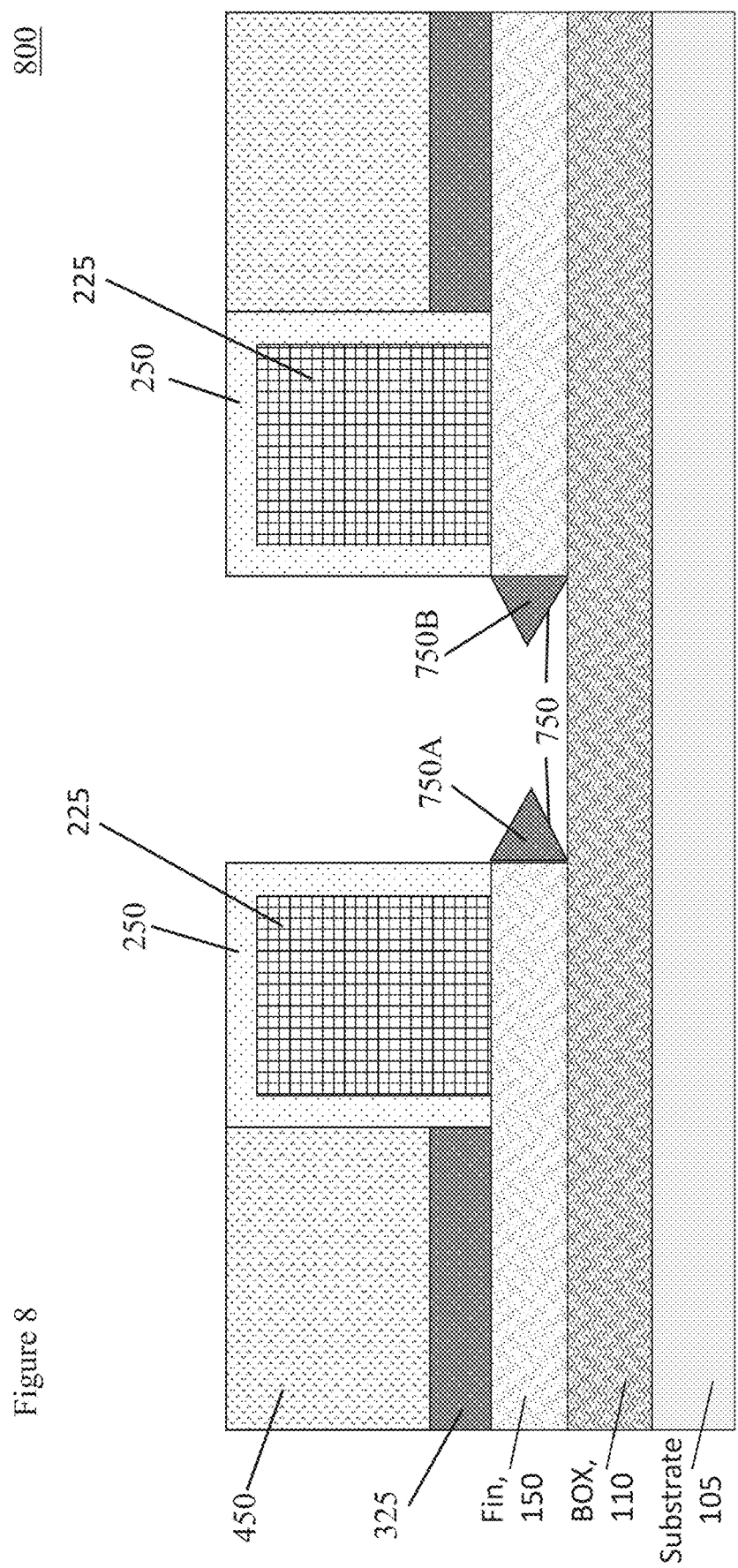
FIG. 8 is a cross section view of an interim structure after mask removal.

FIG. 8 is a cross section view of an interim structure 800 after hard mask 550 removal using known chemistries.

Figure 9:
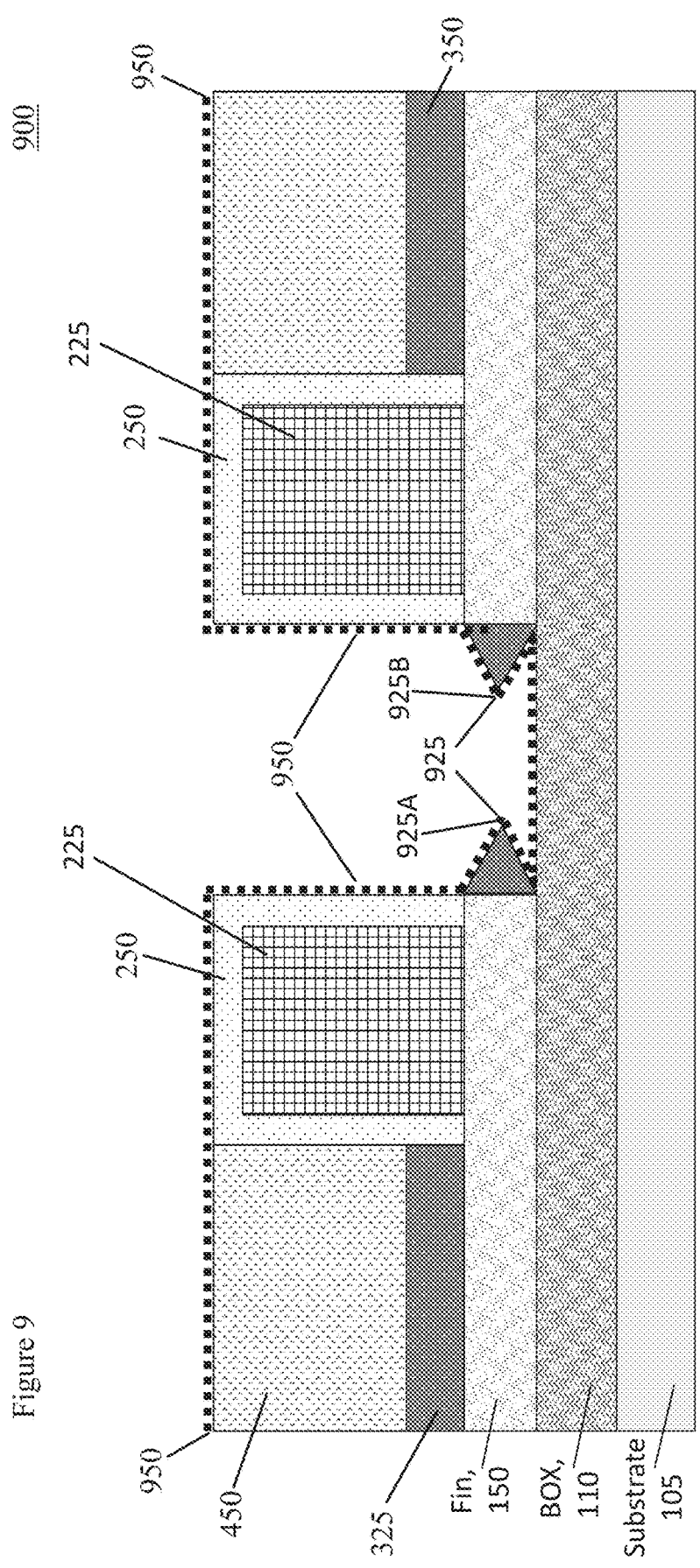
FIG. 9 is a cross section view of an interim structure after deposition of a switching layer.

FIG. 9 is a cross section view of an interim structure 900 after deposition of a switching layer 950.

The switching layer 950 is made of a high k dielectric material deposited by Atomic Layer Deposition (ALD) so that the thickness of the switching layer 950 is accurately controlled between 0.5 nm and 10 nm. Other thicknesses are possible. The switching layer 950 is conformally deposited everywhere, including around the electrode points 725 of the first 750A and second 750B RRAM bottom electrodes 750 so that, in some embodiments, the switching layer 950 forms a filament formation point (925A, 925B), typically points 925, at the precise location of the electric field concentration. (See description below.)

The switching layer 950 may be made of the high-k dielectric material selected from the list of: Hafnium Oxide ($HfO_x$), Tantalum Oxide ($TaO_x$), and Titanium Oxide ($TiO_x$). Other commonly the high-k dielectric materials may be used.

The first filament formation point 925A (later to be the RRAM dielectric in a first RRAM) is electrically and physically connected at an interface to the first RRAM bottom electrode 750A. The first RRAM bottom electrode 750A in turn is electrically, physically, and chemically connected to the first channel 775A at an internal side of the first channel 775A. The second filament formation point 925B (later to be the RRAM dielectric in a second RRAM) is electrically and physically connected at an interface to the second RRAM bottom electrode 750B. The second RRAM bottom electrode 750B in turn is electrically, physically, and chemically connected to the second channel 775B at an internal side of the second channel 775B.

Figure 10:
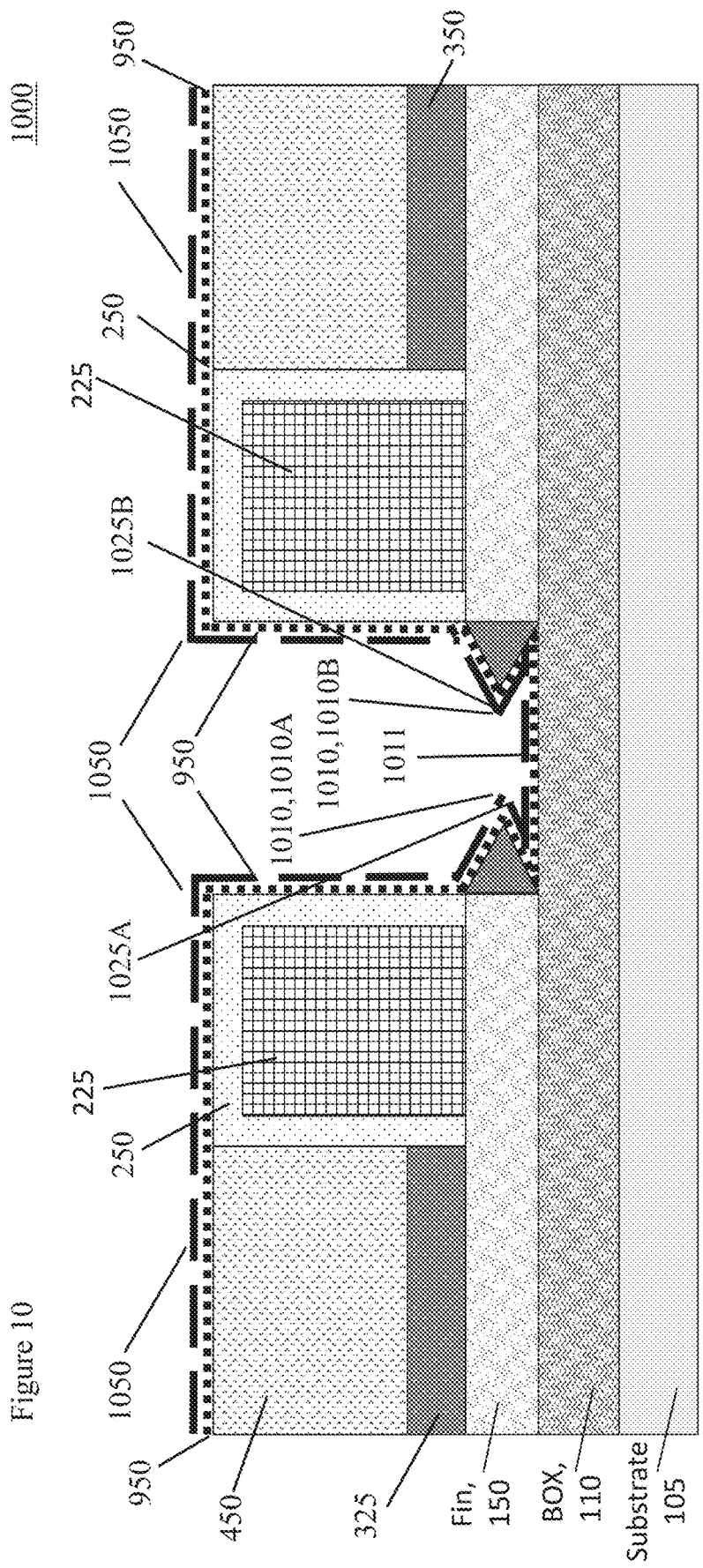
FIG. 10 is a cross section view of an interim structure after deposition of a top electrode on the switching layer.

FIG. 10 is a cross section view of an interim structure 1000 after deposition of a top electrode 1050 on the switching layer 950.

In some embodiments the top electrode 1050 is made of a conductive material, for example, an Aluminum alloy like Titanium Aluminide (TiAl). Other materials include: Titanium Nitride (TiN), TiN alloys, and TiAlC.

In alternative embodiments, the top electrode 1050 is made of a layered stack of conductive material. In some embodiments of the layered stack top electrode 1050 comprises a first layer made of a metal like Titanium Nitride (TiN) between 1 nm and 3 nm thick; a middle layer of an Aluminum alloy between 3 nm to 10 nm thick, or a mixture or laminate thereof; and a second layer made of a metal like TiN between 1 nm and 3 nm thick.

In some embodiments, the top electrode 1050 and/or the layered stack top electrode 1050 are deposited by ALD.

Depositing the top electrode 1050 creates a contact side 1010 and completes formation of a first RRAM 1025A and a second RRAM 1025B.

The first RRAM 1025A comprises: i. the RRAM dielectric material of the first filament formation point 925A conformally layered over the respective electrode point(s) 725 and ii. the part of the top electrode 1050 that is conformally layered over the first filament formation point 925A of the RRAM dielectric material in the switching layer 950. The RRAM dielectric material is the first RRAM S/D side of the first RRAM 1025A. The part of the top electrode 1050 conformally layered over the first filament formation point 925A is a first RRAM contact side 1010A of the first RRAM 1025A.

The second RRAM 1025B comprises: i. the RRAM dielectric material of the second filament formation point 925B material conformally layered over the respective electrode point 725 and ii. the part of the top electrode 1050 that is conformally layered over the second filament formation point 925B of the RRAM dielectric material in the switching layer 950. The RRAM dielectric material is a second RRAM S/D side of the second RRAM 1025B. The part of the top electrode 1050 conformally layered over the second filament formation point 925B material is a second RRAM contact side 1010B of the second RRAM 1025B.

In some embodiments, the top electrode 1050 electrically connects the first 1010A and second 1010B RRAM contact sides 1010 together to form a common side or common connection 1011 between the RRAMs (1025A, 1025B).

During operation, a high intensity electric field is created through the RRAMs 1025 (i.e., through the switching layer 950 dielectric material of each of the filament formation points 925A and 925B) when a voltage appears at interior S/D points (or electrode points) 725A and/or 725B, respectively. Because the RRAM bottom electrodes 750, the interior S/D (electrode) points 725, and RRAMs (typically 1025) are precisely located and the switching layer 950 dielectric material thickness is pre-determined, the location of the created high intensity electric field is predictable and repeatable through the thickness of the switching layer 950 dielectric material at each of the filament formation points 925A and 925B. The filament formation should occur along the path of the highest electric field intensity through the dielectric material at each of the filament formation points 925A and 925B, respectively. Therefore, the present invention can form (or reset) a reliable, predictable, and repeatable filament/conduction path through each of the RRAMs (1025A, 1025B) upon the appropriate voltage application.

In addition, the present invention is easily scaled in size because the formation (or resetting) of the filament(s)/current path(s) depends largely upon the thickness of the switching layer and the electric field applied at the filament formation points 925 which can be controlled independent of the device size.

Figure 11:
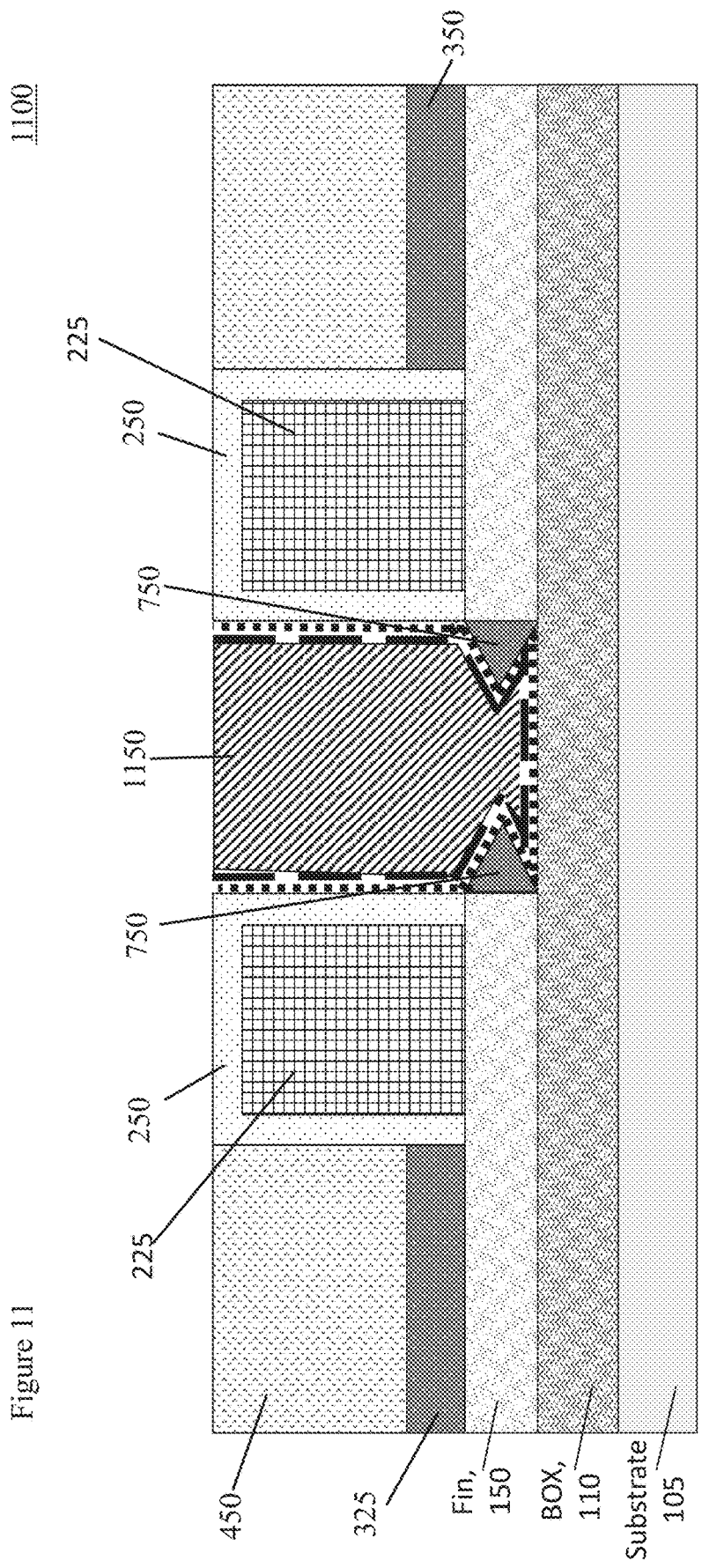
FIG. 11 is a cross section view of an interim structure after deposition of a and a CMP.

FIG. 11 is a cross section elevation of an interim structure 1100 after deposition of a metal fill 1150 and a CMP.

The metal fill 1150 fills the remaining space in the opening 625 and establishes a better external electrical connection to the common connection 1011.

The metal fill 1150 can be any conductive material, e.g. metal, deposited by any number of known techniques like: ALD, CVD, PECVD, Radio Frequency Chemical Vapor Deposition (RFCVD,) PVD, Pulsed Laser Deposition (PLD), Liquid Source Misted Chemical Deposition (LSMCD), and/or sputtering.

In some embodiments of the metal fill 1150 is either Tungsten (W) or Cobalt (Co).

A CMP is then performed to remove any metal fill 1150, top electrode 1050 material, and switch layer 950 material on the surface of the structure 1100. The CMP again stops at the top surface of the spacer 250 and makes the top of the ILD 450, spacers 250, and metal fill 1150 coplanar.

Figure 12:
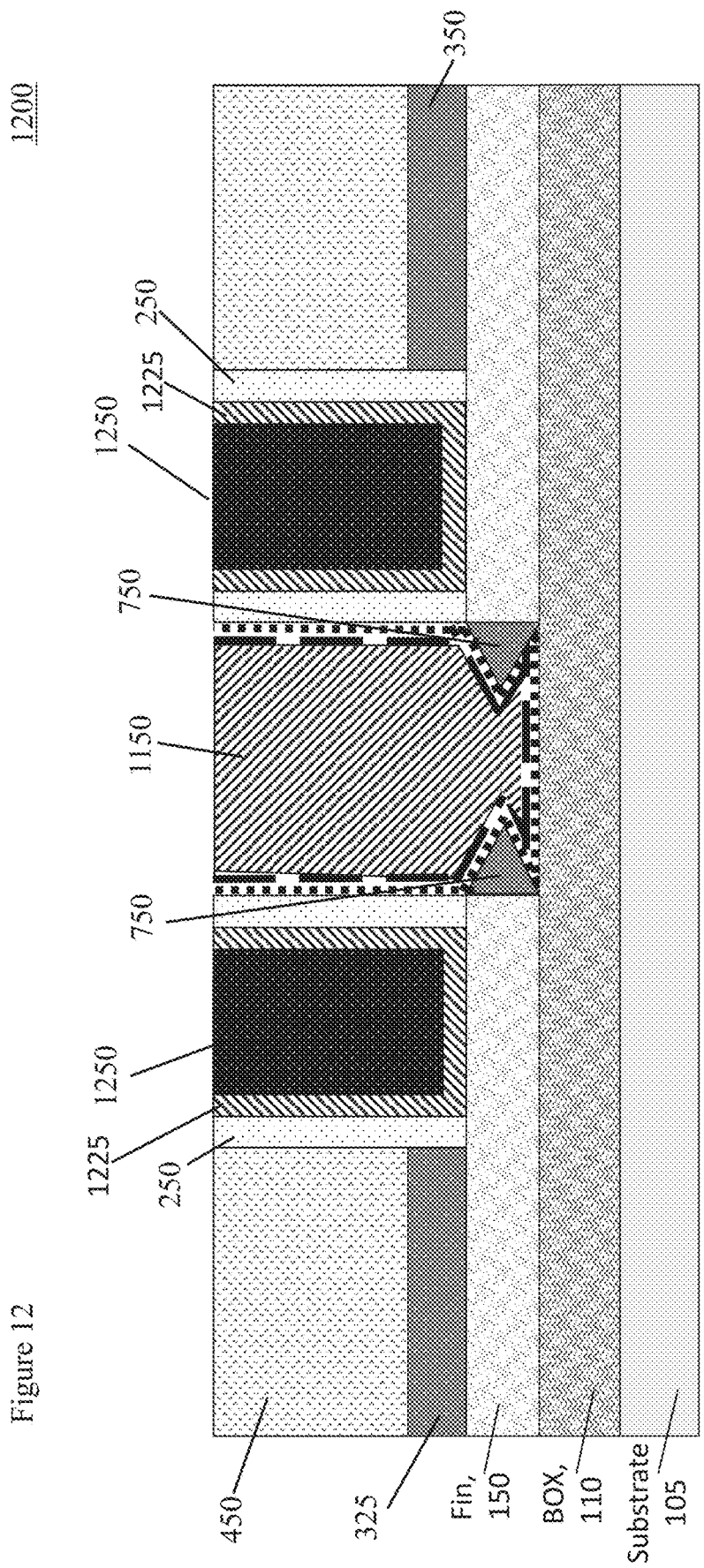
FIG. 12 is a cross section view of an interim structure after pulling the dummy gates and forming a gate stack.

FIG. 12 is a cross section elevation of an interim structure 1200 after pulling the dummy gates 225 and forming a gate stack (typically 1225 and 1250).

The tops of the spacers 250 are removed exposing and allowing removal of the dummy gates 225 by known processes.

A high k gate dielectric 1225 material is conformally deposited into the openings left by the removal of the dummy gates 225. A work function metal 1250 then fills the remaining spaces left by the dummy gate 225 removal.

In some embodiments, the high k gate dielectric 1225 material can be a dielectric material having a dielectric constant greater than 3.9, 7.0, or 10.0. Non-limiting examples of suitable materials for the high k gate dielectric 1225 material include: oxides, nitrides, oxynitrides, silicates, or any combination thereof. Examples of high-k materials (with a dielectric constant greater than 7.0) include, but are not limited to, metal oxides such as: hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high k gate dielectric 1225 layer may be formed by suitable deposition processes, for example, CVD, PECVD, ALD, PVD, evaporation, chemical solution deposition, or other like processes. The thickness of the gate dielectric material may vary depending on the deposition process as well as the composition and number of high-k dielectric materials used.

The work function metal(s) 1250 are disposed over the high k gate dielectric 1225 material. The type of work function metal(s) 1250 depends on the type of transistor. A p-type work function material includes compositions such as: ruthenium, palladium, platinum, cobalt, nickel, and conductive metal oxides, or any combination thereof. An n-type work function material includes compositions such as: hafnium, zirconium, titanium, tantalum, aluminum, metal carbides (e.g., hafnium carbide, zirconium carbide, titanium carbide, and aluminum carbide), aluminides, or any combination thereof.

The work function metal(s) 1250 may be deposited by a suitable deposition process, for example, CVD, PECVD, PVD, plating, thermal or e-beam evaporation, and sputtering.

Figure 13:
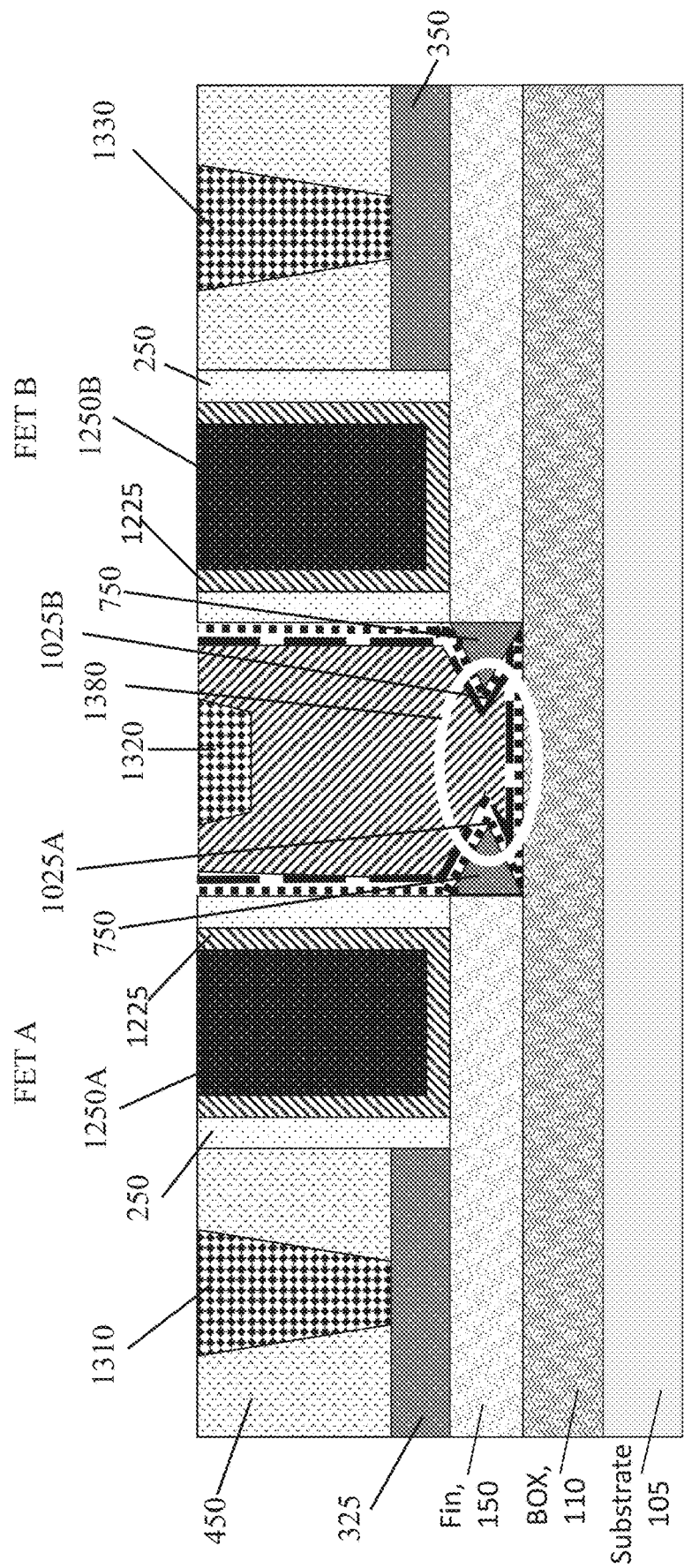
FIG. 13 is a cross section view of a final 2T2R RRAM structure after the addition of contacts.

FIG. 13 is a cross section elevation of a final 2T2R RRAM structure 1300 after the addition of contacts.

Vias penetrate through the IDL 450 down to the first external S/D region 325 and second external region S/D 350, respectively. A conductive material fills the vias to form contacts that are accessible for electrical connections at the top surface of the RRAM structure 1300. Contact 1310 electrically and physically connects to the first external S/D region 325 and contact 1330 electrically and physically connects to the second external S/D region 350. Other known connection types are envisioned.

The conductive material filling the vias can be any conductive metal like Tungsten (W) or Cobalt (Co). These conductive materials are deposited by known deposition processes, for example, CVD, PECVD, PVD, plating, thermal or e-beam evaporation, and sputtering.

Electrical contacts at the top of the surface of the RRAM structure 1300 to the first gate and second gate can be made through the work function metal 1250A and 1250B, respectively.

Electrical contact at the top of the surface of the RRAM structure 1300 can be made directly to the common RRAM connection 1011 through the metal fill 1150. In an alternative embodiment, an additional external contact 1320 is embedded into the metal fill 1150. The additional external contact 1320 can be made of W or Co and is deposited as explained above.

The "white circle" 1380 encloses the two RRAMs (1025A, 1350B) and the common RRAM connection 1011 between them.

Figure 14:
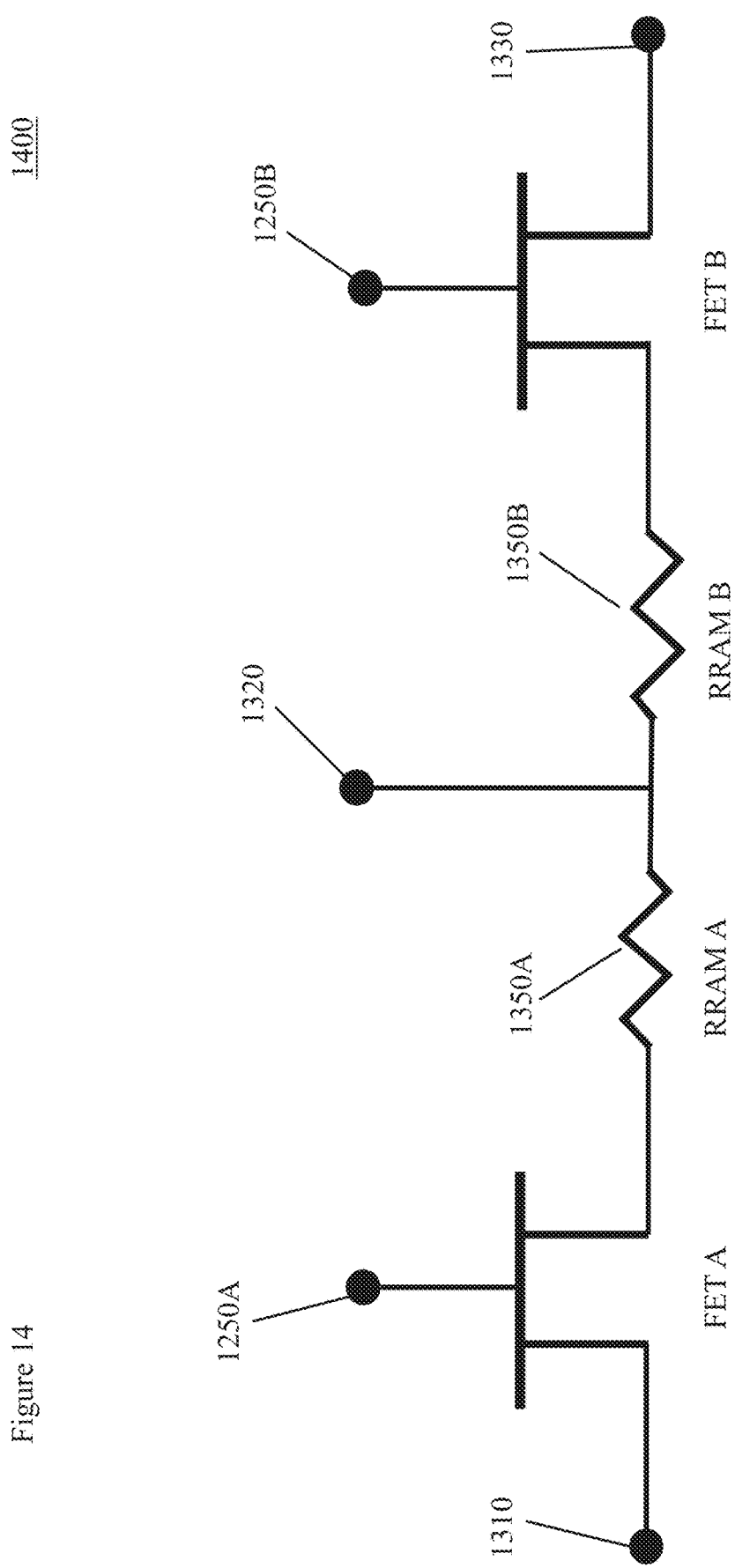
FIG. 14 is a circuit diagram of the 2T2R RRAM.

FIG. 14 is a circuit schematic 1400 of the 2T2R RRAM structure 1300.

The schematic 1400 shows the connection of the first transistor, FinFET A; second transistor, FinFET B; first RRAM 1025A, RRAM A; and the second RRAM 1025 B, RRAM B.

The schematic 1400 show 5 external connections to the device 1400:

a. a first external contact 1310 electrically and physically connects to the first external source/drain (S/D) region 325;

b. a second external contact 1330 electrically and physically connects to the second external source/drain (S/D) region 350;

c. a first external gate connection 1250A, d. a second external gate connection 1250B; and e. a common external contact 1320 electrically and physically connected in common with the common connection 1011.

Figure 15:
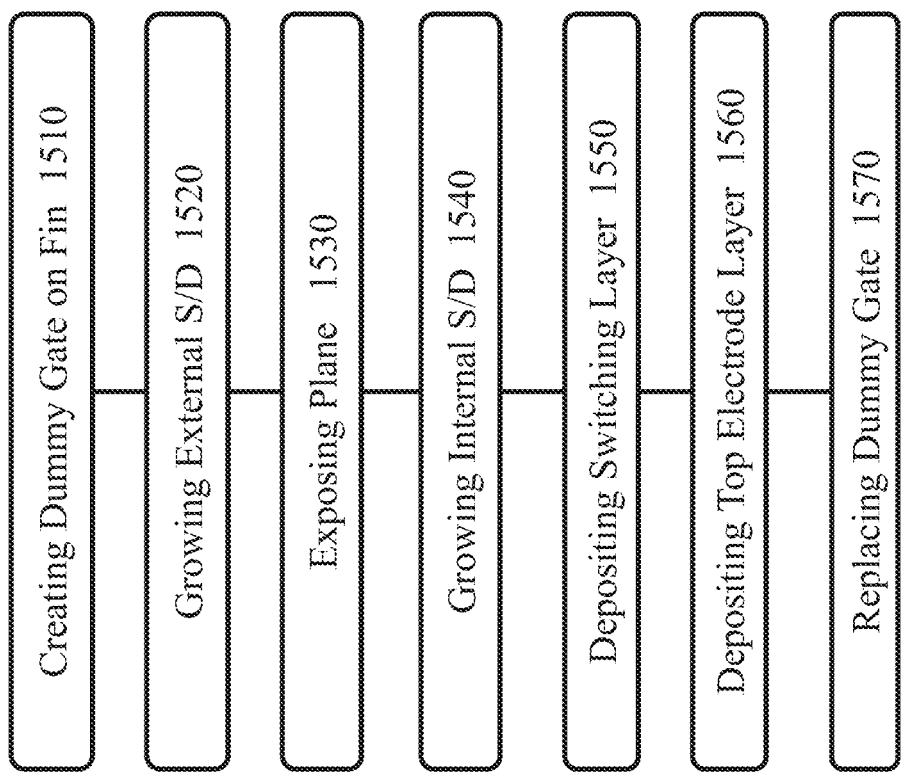
FIG. 15 is a flow chart showing a process of making the 2T2R RRAM.

FIG. 15 is a flow chart showing a process 1500 of making the 2T2R RRAM of FIGS. 1 through 12. The 2T2R RRAM is made with a novel configuration of traditional CMOS manufacturing processes.

The process 1500 begins with step 1510 by depositing a dummy gate 225 and surrounding spacer 250 on the fin 150 that is perpendicular to the substrate 105, as described in the descriptions of FIGS. 1 and 2.

The growing an external source/drain (S/D) occurs in step 1520 as explained in the description of FIG. 3.

Step 1530 is the exposing of the crystal surface orientation plane at the end 650 of the fin 150 that is perpendicular to the substrate 105, as described in the description of FIGS. 4, 5, and 6.

The growing of the RRAM bottom electrode 750 on the exposed surface end 650 occurs in step 1540 and is further described in the description of FIG. 7.

Depositing 1550 the switching layer 950 on the RRAM bottom electrode 750 occurs in step 1550 and is described in the description of FIG. 9.

Depositing 1560 the top electrode 1050 layer on the switching layer 950 to form the RRAM 1025 is done in step 1560 and further described in the description of FIG. 10.

Step 1570 is replacing the dummy gate with a gate stack as described further in the description of FIG. 12.

In neuromorphic computing applications, a RRAM can be used as a connection (synapse) between a pre-neuron and a post-neuron, representing a connection weight in the form of device resistance. Multiple pre-neurons and post-neurons can be connected through a crossbar array of RRAMs, which will naturally express a fully connected neural network.

For online training (weight update) of Deep Neural Network (DNN), some embodiments would use two unipolar RRAMs with linear switching for differential weight. One of the RRAMs is used as a reference.

The 2T2R device disclosed herein can perform this function. For example, the first RRAM can be used as a reference cell and the second RRAM can be used for weight update. Differential weight can represent both positive and negative values.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A resistive random-access memory (RRAM) device comprising:
   a fin field effect transistor (FinFET) comprising:
   a channel;
   a source/drain (S/D), the S/D connected to an external S/D side of the channel;
   a RRAM bottom electrode, the RRAM bottom electrode directly connected to an internal side of the channel, the RRAM bottom electrode being an internal S/D;
   a gate stack encompassing the channel, the gate stack having an external gate connection; and
   a RRAM with a RRAM contact side and a RRAM S/D side, the RRAM S/D) side being a dielectric disposed on and in contact with the RRAM bottom electrode, wherein the RRAM contact side has a first layer a middle layer, and a second layer, at least one of the first layer, middle layer, and second layer made of a conductive material different than the conductive materials making the other of the layers.

2. A device, as in claim 1, where the channel has crystal orientation with a Miller Index of 100 at a substrate interface with a substrate or a BOX and the internal side of the channel has crystal orientation with a Miller index of 110 at an electrode interface with the RRAM bottom electrode.

3. A resistive random-access memory (RRAM) device comprising:
   a first fin field effect transistor (FinFET) comprising:
   a first channel;
   a first external source/drain (S/D), the first external S/D connected to an external S/D side of the first channel;
   a first RRAM bottom electrode, the first RRAM bottom electrode directly connected to an internal side of the first channel, the first RRAM bottom electrode being a first internal S/D of the first FinFET;
   a first gate stack encompassing the first channel, the first gate stack having a first external gate connection; and
   a first RRAM with a first RRAM contact side and a first RRAM S/D side, the first RRAM S/D side being a dielectric disposed on and in contact with the first RRAM bottom electrode;
   a second FinFET comprising:
   a second channel;
   a second external S/D, the second external S/D connected to an external S/D side of the second channel;
   a second RRAM bottom electrode, the second RRAM bottom electrode directly connected to an internal side of the second channel, the first RRAM bottom electrode being a first internal S/D of the second FinFET;
   a second gate stack encompassing the second channel, the second gate stack having a second external gate connection; and
   a second RRAM with a second RRAM contact side and a second RRAM S/D side, the second RRAM S/D side being a dielectric disposed on and in contact with the second RRAM bottom electrode; and
   a common external contact electrically connected to both the first RRAM contact side and second RRAM contact side,
   wherein the first RRAM bottom electrode and the second RRAM bottom electrode each have a crystal orientation that mirrors one another.

4. A device, as in claim 3, where the first and second RRAM bottom electrodes each have a diamond-shaped, facetted side with at least one first and second RRAM electrode point, respectively.

5. A device, as in claim 4, where a voltage applied to the first and second RRAM bottom electrodes, respectively, creates an electric field concentration at the first and second RRAM electrode points.

6. A device, as in claim 3, where the first channel and the second channel are made of one of Silicon (Si) or Silicon Germanium (SiGe).

7. A device, as in claim 3, where the dielectric comprising each of the first and second RRAM S/D sides is a RRAM dielectric layer comprising a high k material.

8. A device, as in claim 7, where the RRAM dielectric layer is a high k dielectric layer made of one of the following: Hafnium Oxide ($HfO_x$), Tantalum Oxide ($TaO_x$), and Titanium Oxide ($TiO_x$).

9. A device, as in claim 3, where the first RRAM contact side and the second RRAM contact side are made of one of the following: TiN, Al-containing alloy, and mixture and laminate thereof.

10. A device, as in claim 3, where the first RRAM contact side and the second RRAM contact side have a first layer, a middle layer, and a second layer.

11. A device, as in claim 10, where the first and second layer are made of Titanium Nitride (TiN).

12. A device, as in claim 10, where the middle layer is made of Al-containing alloy.

13. A device, as in claim 3, where the first external S/D, the second external S/D, the first RRAM bottom electrode, and the second RRAM bottom electrode are doped with the same doping being one of n-doped and p-doped.

14. A device, as in claim 3, where the first RRAM bottom electrode is doped the same as the first external S/D and the second RRAM bottom electrode is doped the same as the second external S/D.

15. A device, as in claim 3, where the first and second RRAM bottom electrodes each have a crystal orientation that is different than a substrate crystal orientation of a substrate.

16. A device, as in claim 3, where the dielectric is between 0.5 nanometers (nm) and 10 nm thick.

17. A device, as in claim 3, where the first RRAM contact side and the second RRAM contact side is made of a contact side conductive material.

18. A device, as in claim 17, where the contact side conductive material is one of the following: an aluminum alloy, Titanium Aluminide (TiAl), Titanium Nitride (TiN), a TiN alloy, and TiAlC.

19. A device, as in claim 17, where the contact side conductive material is between 1 nm and 3 nm thick.

* * * * *